United States Patent
Brar

(10) Patent No.: US 6,706,574 B2
(45) Date of Patent: Mar. 16, 2004

(54) FIELD EFFECT TRANSISTOR AND METHOD FOR MAKING THE SAME

(75) Inventor: Berinder Brar, Newbury Park, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/147,550

(22) Filed: May 17, 2002

(65) Prior Publication Data

US 2002/0175346 A1 Nov. 28, 2002

Related U.S. Application Data

(62) Division of application No. 09/434,773, filed on Nov. 4, 1999, now Pat. No. 6,414,340.

(51) Int. Cl.$^7$ .................. H01L 21/338; H01L 21/00; H01L 21/336; H01L 21/3205

(52) U.S. Cl. ................. 438/167; 438/48; 438/94; 438/289; 438/590

(58) Field of Search .................. 438/94, 289, 93, 438/167, 590, 48, 284

(56) References Cited

U.S. PATENT DOCUMENTS

| | | | |
|---|---|---|---|
| 4,476,477 A | | 10/1984 | Capasso et al. ......... 257/185 |
| 4,763,183 A | * | 8/1988 | Ng et al. ................ 257/288 |
| 5,115,289 A | * | 5/1992 | Hisamoto et al. ....... 257/347 |
| 5,272,369 A | * | 12/1993 | Colinge et al. ......... 257/352 |
| 5,942,781 A | | 8/1999 | Burr ...................... 257/347 |
| 6,046,062 A | | 4/2000 | Huang et al. ............. 438/18 |
| 6,159,829 A | * | 12/2000 | Warren et al. ........... 438/530 |
| 6,204,534 B1 | | 3/2001 | Adan ...................... 257/347 |
| 6,282,124 B1 | * | 8/2001 | Van Houdt et al. .... 365/185.28 |
| 6,300,819 B1 | | 10/2001 | De et al. ................. 327/534 |

FOREIGN PATENT DOCUMENTS

| | | | | |
|---|---|---|---|---|
| EP | 0481555 B1 | | 4/1992 | ....... H01L/29/812 |
| JP | 04142775 | * | 5/1992 | |
| JP | 06140430 | * | 5/1994 | |

OTHER PUBLICATIONS

H. Wang, G.I. Ng., M. Gilbert and P.J. O'Sullivan, *Suppression of I–V Kink In Doped Channel InAlAs/INGaAs/InP Heterojunction Field–Effect Transister (HFET) Using Silicon Nitride Passivation*, Electronics Letters, Oct. 10th, 1996, vol. 32, No. 21, pp. 2026–2027.

A. Georgakilas, K. Zekentes, N. Kornilios, G. Halkias, A. Dimoulas, A. Christou, F. Peiro, A. Cornet, T. Benyattou, A. Tabata, G. Guillot, *Suppression of the Kink Effect In InGaAs/InAlAs HEMTs Grown by MBE by Optiziming the inAlAs Buffer Layer*, pp. 97–100, unknown.

L.F. Luo, K.F. Longenbach, W.I. Wang, *Kink–Free AllnAs/GainAs/InP HEMTs Grown by Molecular Beam Epitaxy*, Electronics Letters, Jun. 7, 1990, vol. 26, No. 12, pp. 779–780, Mar. 5, 1990.

(List continued on next page.)

*Primary Examiner*—Matthew Smith
*Assistant Examiner*—Chuong A. Luu
(74) *Attorney, Agent, or Firm*—Baker Botts L.L.P.

(57) ABSTRACT

The field effect device consisting of a substrate, a conducting backplane formed in the substrate, a source and a drain disposed above the conductive backplane, a gate insultatively disposed above the substrate between the source and drain, and a backgate contact electrically coupled to the conducting backplane.

4 Claims, 3 Drawing Sheets

OTHER PUBLICATIONS

X. Li, K.F. Longenback, Y. Wang, Wein I. Wang, *High-Breakdown-Voltage AlSbAs/InAs n-Channel Field-Effect Transistors*, IEEE Electron Device Letters, vol. 13, No. 4, Apr. 1992, pp. 192–194.

Chenming Hu, *Hot Electron Effects in MOSFET's*, IEDM Tech. Dig., 1983, pp. 176–181.

A.A. Moolji, S.R. Bahl, J.A. del Alamo, *Impact Ionization in InAlAs/InGaAs HFET's*, IEEE Electron Device Letters, vol. 15, No. 8, Aug. 1994, pp. 313–315.

Tong Qin–Yi, Xu Xiao–Li and Zhang Hui–Zhen, *Elimination of Kink Effect In Fully Depleted Buried Channel SOI MOSFET Based On Silicon Direct Bonding Technology*, IEEE Publication, 1990, pp. 99–100.

Berinder Brar, *Impact Ionization in InAs–AlSb Heterostructure Field–Effect Transistors Ph.D. Dissertation*, ECE Technical Report #95–21, Department of Electrical and Computer Engineering, University of California, Santa Barbara, Sep. 1995.

* cited by examiner

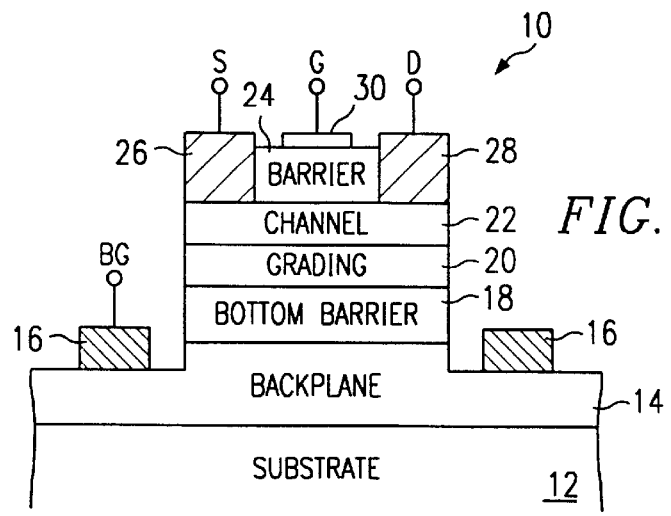
FIG. 1
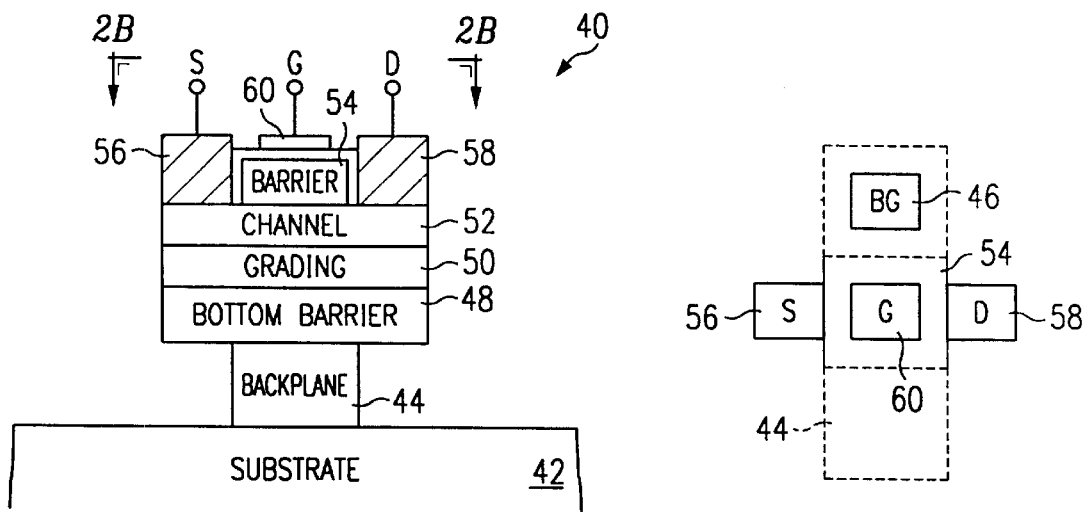
FIG. 2A
FIG. 2B
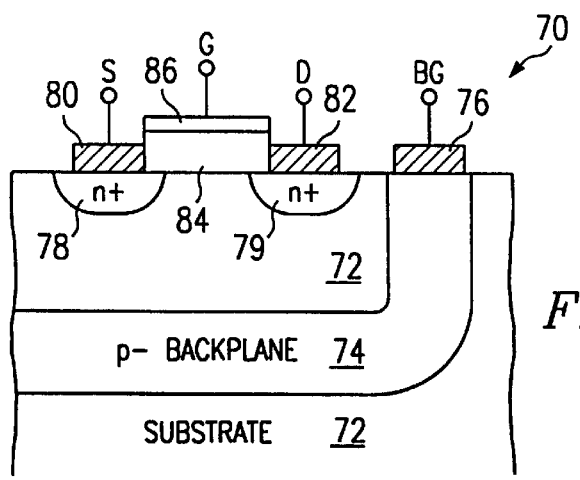
FIG. 3

FIELD EFFECT TRANSISTOR AND METHOD FOR MAKING THE SAME

This application is a divisional of U.S. Ser. No. 09/434,773 filed Nov. 4, 1999, now U.S. Pat. No. 6,414,340.

This invention was made under Government Contract No. N66001-96-C-8620. The government has certain rights in this invention.

TECHNICAL FIELD OF THE INVENTION

This invention is related in general to the field of semiconductor devices and fabrication. More particularly, the invention is related to a field effect transistor and a method for making the same.

BACKGROUND OF THE INVENTION

The kink effect exhibited in field effect transistors (FETs) has long been studied, modeled and analyzed by engineering, research, and academic groups without producing an effective solution to eliminate it without introducing new problems. The kink effect derives its name from the sometimes sharp bend in the drain current-voltage (I–V) characteristics of the device. The I–V characteristics show undesirably high drain conductances that increase with increasing drain voltage. It has been shown that silicon-based field effect transistors as well as compound semiconductor-based field effect transistors experience the same kink effect.

Heterostructure field effect transistors are well suited for many high speed, high frequency applications. However, these heterostructure field effect transistors, are plagued by the same kink effect found in silicon field effect transistors. Quantum well heterostructure field effect transistors further aggravate the problem by confining the impact ionized holes. As a result, a substantially large gate-bias voltage is required to capture the holes out at the gate electrode.

In addition to the kink effect, a related effect caused by the impact ionized holes is a large gate leakage current. Some of the ionized holes are attracted to and collected by the negatively biased gate terminal and create a leakage current. Engineering and scientific literature have also documented other undesirable effects primarily caused by the impact ionized holes.

Accordingly, it is advantageous to provide a solution that removes the impact ionized holes to eliminate the kink effect, gate leakage, and other undesirable effects.

SUMMARY OF THE INVENTION

Accordingly, there is a need for field effect transistor structures that do not exhibit the kink effect and a method for making the same.

In accordance with the present invention, field effect devices are provided which eliminate or substantially reduces the disadvantages associated with prior field effect devices.

In one aspect of the invention, the field effect device consists of a substrate, a conducting backplane formed in the substrate, and a source and a drain disposed above the conductive backplane. A gate is insulatively disposed above the substrate between the source and drain, and a backgate contact is electrically coupled to the conducting backplane.

In another aspect of the invention, the method of making field effect devices includes forming a substrate, a conducting backplane disposed above the substrate, a source and drain disposed above the backplane, a gate contact insulatively disposed above the substrate between the source and drain, and a backgate contact coupled to the conducting backplane.

In yet another aspect of the invention, the method of operating a kink-free field effect device consists of applying bias voltages to a gate, source and drain of the field effect device. The method also consists of applying a negative bias voltage to a conductive backplane and attracting and collecting impact ionized holes generated near the valence band of the field effect device by the conductive backplane.

One technical advantage of the invention is its application to most if not all field effect transistor structures for neutralizing and collecting of impact ionized holes eliminate the kink effect and other undesirable characteristics. Another technical advantage of the invention is that the solution is directed at the source of the problem—the uncontrolled trapping and untrapping of impact ionized holes in the valence band. Yet another technical advantage of the present invention is its substantially total elimination of the kink effect by neutralizing and collecting substantially all of the impact ionized holes without the use of large bias voltages.

It may be seen that the conducting backplane is most effective in collecting the impact ionized holes if there is no barrier to hole-collection by the backplane in the valence band. In the present device the valence band barrier is removed by grading continuously (or in small steps) from the channel where the holes are generated (narrow Energy gap) to the lower confining barrier (wide Energy gap) hence eliminating the valence band barrier.

The backplane is less effective if the grading is absent. The grading does not deleteriously affect operation of the FET because the electron confinement is restored as the backplane is biased negatively, for hole-collection, with respect to the channel.

BRIEF DESCRIPTION OF THE DRAWINGS

For a better understanding of the present invention, reference may be made to the accompanying drawings, in which:

FIG. 1 is a schematic diagram of an embodiment of a compound heterostructure field effect transistor constructed according to the teachings of the present invention;

FIG. 2A is a schematic diagram of a second embodiment of a compound heterostructure field effect transistor constructed according to the teachings of the present invention;

FIG. 2B is a top view of the second embodiment of the compound heterostructure field effect transistor shown in FIG. 2A and constructed according to the teachings of the present invention;

FIG. 3 is a schematic diagram of an embodiment of a silicon field effect transistor constructed according to the teachings of the present invention;

DETAILED DESCRIPTION OF THE INVENTION

Figure 4:
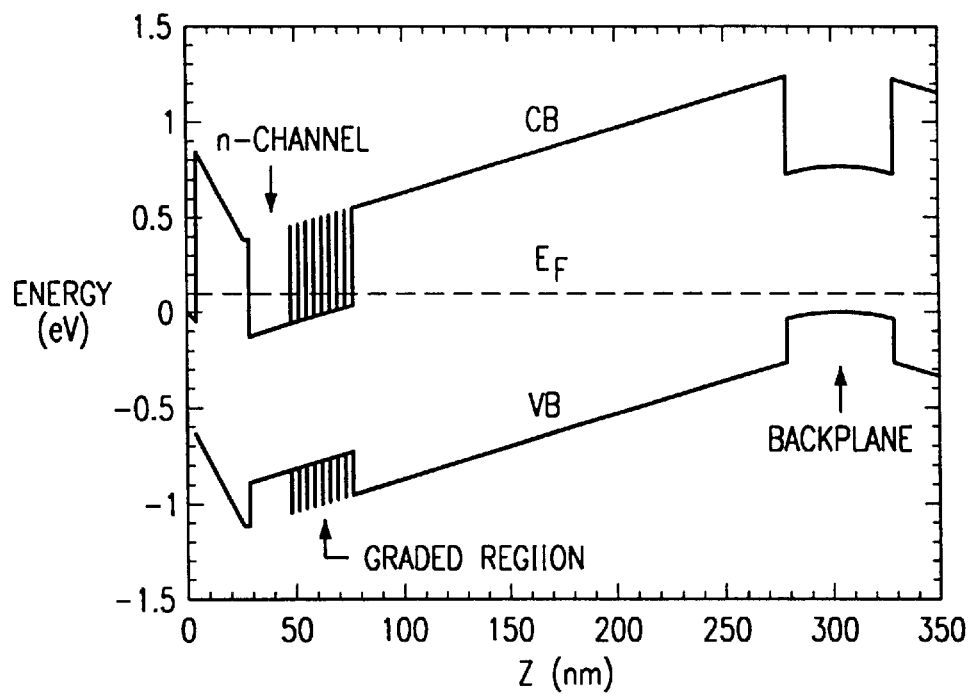
FIG. 4 is a an energy band diagram of the compound heterostructure field effect transistor with digital grading constructed according to the teachings of the present invention.

The present invention is applicable to any field effect transistor structure that experiences the kink effect due to the positive charge of impact ionized holes in the valence band. Although the descriptions below may focus on heterostructure field effect transistors constructed of certain compound semiconductor materials for the purpose of describing the invention, the invention is equally applicable to other field effect transistor devices.

Referring to FIG. 1, a simplified schematic block diagram of an embodiment of a compound heterostructure field effect transistor 10 constructed according to the teachings of the present invention is shown. Transistor 10 may be a compound semiconductor heterostructure field effect transistor constructed from compounds of elements such as aluminum (Al), arsenic (As), indium (In), gallium (Ga), antimony (Sb), and phosphorous (P). Exemplary III–V compounds used to construct heterostructure field effect transistors include InGaAs, InAlAs, AlGaAs, AlGaSb, GaSb, AlSb, InAs, AlSbAs, GaAs, and InP.

Transistor 10 includes a substrate 12 upon which a p-type conducting backplane 14 is formed. Substrate 12 may be constructed of materials such as InP or GaAs. Backplane 14 may be constructed from a semiconductor material, such as p-type InGaAs or p-type GaAs. Disposed above backplane 14 is a bottom barrier 18. Bottom barrier 18 may be constructed from InAlAs or AlGaAs, for example. Bottom barrier 18 insulatively separates backplane 14 from a graded region 20 and a channel 22 that are disposed above bottom barrier 18. Two exemplary compound materials for forming channel 22 may be InGaAs or GaAs. Graded region 20 is at the interface between bottom barrier 18 and channel 22, and contains alloys of the compound materials from both layers 18 and 22. The grading may be continuous (analog) or discrete (digital) with the channel compound material increasing in percentage as one moves from bottom barrier 18 to channel 22. The graded region may be formed by grading a layer of bottom barrier 18 adjacent to channel 22. Thereafter, source and drain contacts 26 and 28 are formed above channel 22. An insulating top barrier 24 is disposed above channel 22 and between source and drain contacts 26 and 28.

FIGS. 2A and 2B are respectively a simplified schematic block diagram and a top view of a second embodiment of a compound heterostructure field effect transistor 40 constructed according to the teachings of the present invention. Transistor 40 includes a substrate 42 upon which a p-type conducting backplane 44 is formed. Substrate 42 may be constructed of materials such as InP or GaAs. Backplane 44 may be constructed from a semiconductor material, such as p-type InGaAs or p-type GaAs. A bottom barrier 48 is disposed above backplane 44. Bottom barrier 48 may be constructed from InAlAs or AlGaAs, for example. Bottom barrier 48 insulatively separates backplane 44 and substrate 42 from a graded region 50 and a channel 52. Two exemplary compound materials for forming channel 52 may be InGaAs or GaAs. Graded region 50 forms a junction between bottom barrier 48 and channel 52 that contains alloys of the compound materials from both bottom barrier 48 and channel 52. The grading may be continuous (analog) or discrete (digital) with the channel compound material increasing in percentage as one moves from bottom barrier 48 to channel 52. The graded region may be formed by grading a layer of bottom barrier 48 adjacent to channel 52. Source and drain contacts 56 and 58 are formed above channel 52. An insulating top barrier 54 is disposed above channel 52 and between source and drain contacts 56 and 58.

Referring to FIG. 2B, backplane 44 is shown disposed below gate 60 but not source contact 56 or drain contact 58. Backplane 44 is selectively etched or removed by a fabrication method to reduce or eliminate capacitive coupling between source 56 and backplane 44 and drain 58 and backplane 44, which is effectively a capacitive coupling between the source and drain, $C_{DS}$. At high frequencies, $C_{DS}$ may undesirably short source to drain. By creating a distance between drain 56 to backplane 44 and source 58 to backplane 44, this undesirable capacitance is substantially reduced or eliminated.

Figure 5:
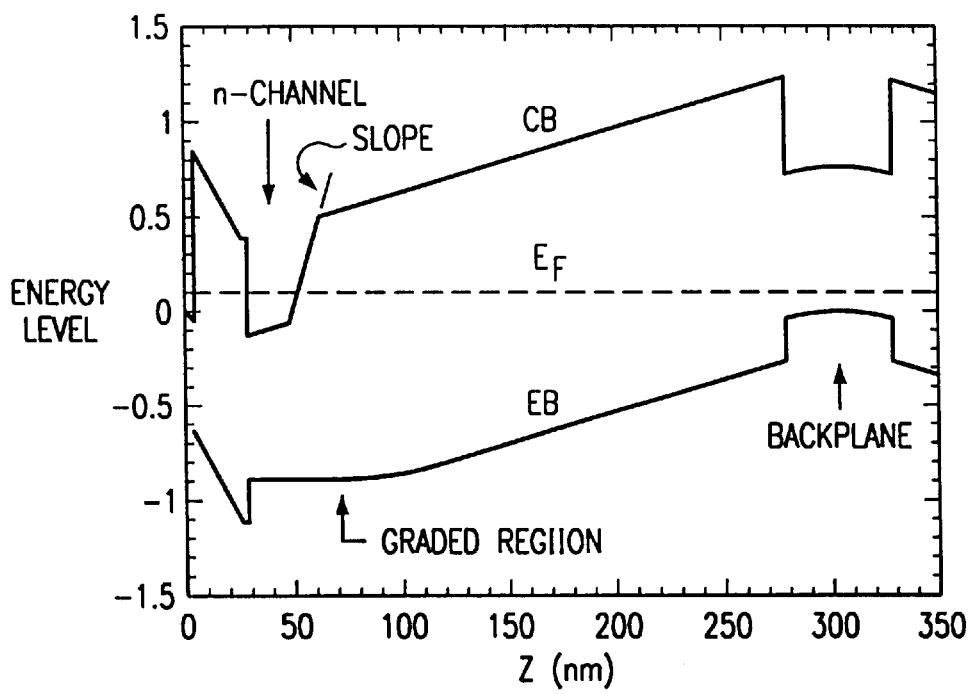
FIG. 5 is an energy band diagram of the compound heterostructure field effect transistor with analog grading constructed according to an embodiment of the present invention.

Referring to FIGS. 4 and 5, energy band diagrams of exemplary InAlAs/InGaAs/InP heterostructure field effect transistors constructed according to the teachings of the present invention are shown. FIG. 4 is an energy band diagram of a field effect transistor with a digital or superlattice graded region, and FIG. 5 is an energy band diagram of a field effect transistor with an analog or continuous graded region. It may be seen that the wall of the quantum well on the substrate side in the valence band (VB) is effectively flattened or neutralized by the combined structural changes of grading the junction between the channel and bottom barrier and the negative bias voltage of the backplane. Grading alone would have introduced a gentler slope of the quantum well wall on the substrate side. Using a negatively biased backplane alone would have introduced an overall slope of the conduction and valence bands, but left the vertical slope of the quantum well wall unchanged. However, with the combination of both the bottom barrier grading and the negatively biased backplane, the substrate side wall of the quantum well is substantially vertical, thus enabling the negative charged backplane to successfully attract and collect the impact ionized holes, while still providing adequate confinement for the electrons.

Figure 7:
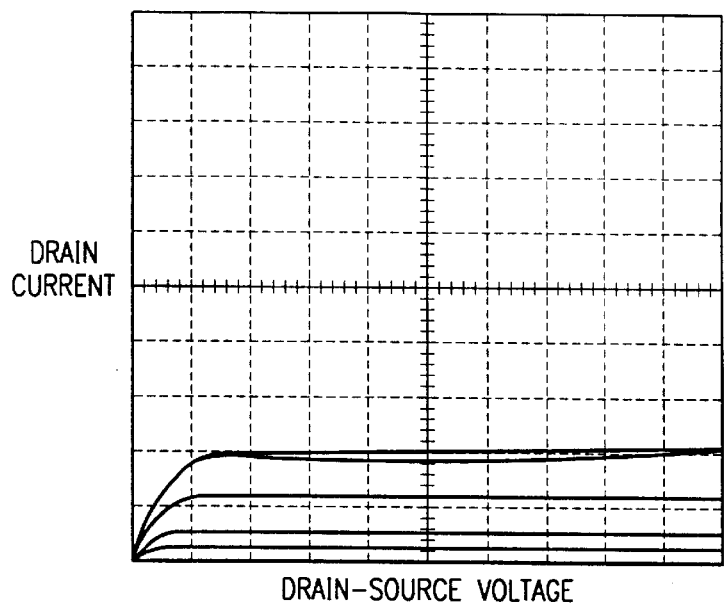
FIG. 7 is a plot of output characteristics of a heterostructure field effect transistor constructed according to the teachings of the present invention showing the absence of the kink effect.
Figure 6:
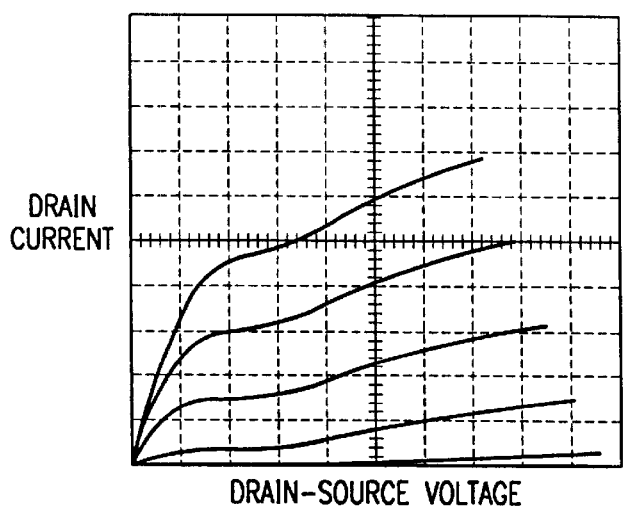
FIG. 6 is a plot of output characteristics of a typical heterostructure field effect transistor exhibiting the kink effect.
Figure 8:
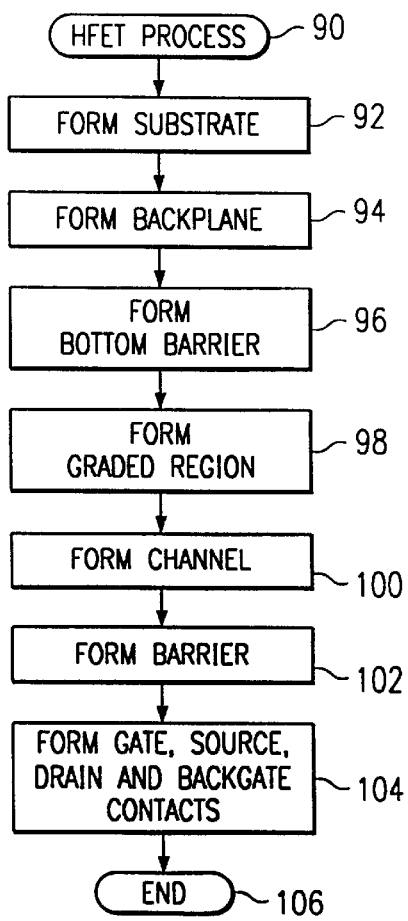
FIG. 8 is a flowchart of an exemplary process of fabricating a heterostructure field effect transistor according to the present invention.

In operation, hot electrons acquire energies greater than the semiconductor bandgap and impact ionizes electrons out of the valence band. The impact ionization generates mobile electrons and holes. The impact ionized electrons are generally collected by the drain, while the impact ionized holes travel toward the source and gate or are trapped in the quantum well in the valence band. The resultant kink effect is apparent in FIG. 6, which shows output characteristics of a typical InGaAs/InAlAs/InP heterostructure field effect transistor. However, with the combination of a graded region and a negatively biased backplane and backgate, the resultant output characteristics of an InGaAs/InAlAs/InP heterostructure field effect transistor constructed according to the present invention is shown in FIG. 7. It is apparent that the I–V characteristics are linear and the kink effect is eliminated.

The principle behind the invention is also applicable to field effect transistors that are not heterostructure field effect transistors. Any field effect transistor which suffers from uncontrolled impact ionized holes can benefit from this invention. FIG. 3 is a simplified schematic block diagram of an embodiment of a silicon field effect transistor 70 constructed according to the teachings of the present invention. Silicon field effect transistor 70 includes a substrate 72 in which a p-type conducting backplane 74 is formed. Backplane 74 is coupled to a backgate contact 76. Transistor 70 further includes n+ doped source and drain regions 78 and 79, respectively. A gate 86 is insulatively disposed above substrate 72. An insulative layer 84, such as oxide, is disposed between gate 86 and substrate 72. A graded region is not needed in a silicon transistor.

Under normal device operation, hot electrons acquire energies greater than the semiconductor bandgap and impact ionize electrons out of the valence band. The impact ionization generates additional unwanted electrons in the conductive band and holes in the valence band. The impact ionized electrons are attracted to and collected by the drain, while the impact ionized holes travel toward the source and accumulates in the valence band near the source. The accumulation of holes creates a local positively charged region, which may counteract the negative bias voltage at the gate. This decreases the energy barrier between the source and the channel, which allows more electrons to be injected into the channel, become hot and impact ionize even more electrons in the valence band and creating more holes (positive feedback). In a field effect device of the present invention, with backgate 76 and backplane 74 negatively biased, the impact ionized holes can be removed from the channel or quantum well channel and become drawn toward backplane 74 and collected before they can migrate and accumulate near the source and gate junction. Therefore, the kink effect is eliminated.

FIG. 7 is a flowchart of an exemplary process 90 of fabricating a heterostructure field effect transistor according to the present invention. For the sake of clarity and to more distinctly point to the invention, certain structural layers not directly related to the present invention may be omitted in the following discussion. In block 92, a substrate is formed. A backplane is then formed above the substrate, as shown in block 94. A bottom barrier is then formed above the backplane, as shown in block 96. Part of the bottom barrier is graded to form a graded region, as shown in block 98. As described above, the graded region contains an alloy of the bottom barrier material and the channel material, which is formed above the graded region, as shown in block 100. Above the channel, a top barrier layer is formed, as shown in block 102. Thereafter in block 104, gate source, drain and backgate contacts may be formed. The process ends in block 106.

In general, the layers may be formed using conventional fabrication techniques and processes. For example, molecular beam epitaxy (MBE), metal organic vapor phase epitaxy (MOVPE), and the like may be used to grow the various device layers. Known etching processes may also be used to selectively remove materials. Further, other known processing techniques for heterostructure field effect transistors, such as lattice matching the materials of adjacent layers may also be considered and utilized.

An exemplary partial recipe for fabricating an InAlAs/InGaAs/Inp heterostructure field effect transistor according to the teachings of the present invention is provided below:

| Thickness (Å) | Material | Doping | Comments/Structure |
|---|---|---|---|
| 205 | InAlAs | undoped | top barrier |
| 30 | InAlAs | 1e19 | HFET modulation doping |
| 15 | InAlAs | undoped | HFET spacer layer |
| 200 | InGaAs | undoped | channel |

-continued

| Thickness (Å) | Material | Doping | Comments/Structure |
|---|---|---|---|
| Lgrd | InGaAs ->InAlAs grading | 1e19 | bottom barrier graded region |
| Lbb | InAlAs | undoped | bottom barrier |
| 500 | InAlAs | Na | P-backplane |
| 30 | InP | Na | P-backplane etch-stop layer |
| 500 | InGaAs | Na | P-backplane contact layer or backgate |
| 500 | InAlAs | undoped | backgate to Mesa? floor spacer |
| 30 | InP | undoped | Mesa floor etch-stop layer |
| 1000 | InAlAs | undoped | to eliminate decomposition of InP in 350 degree nitride |
| | InP | | InP substrate |

Note that many steps forming layers and structures largely unrelated to the teachings of the present invention are not shown. The Lgrd and Lbb notation refer to the thickness of the graded region and the bottom barrier, respectively. Depending on the desired thickness of the graded region, the thickness of the bottom barrier may be adjusted up or down accordingly. The graded region may be graded continuously or in an analog manner, in which the changing composition varies gradually. The grading may also be done in an digital manner, in which the change in composition occurs at regular thicknesses, and the increase/decrease of the alloy materials occur in a regular manner. For example, if the graded region is 100 Å thick, and the grading is over five periods of 20 Å each:

| Channel | (InGaAs) |
|---|---|
| 16 Å | InGaAs |
| 4 Å | InAlAs |
| 12 Å | InGaAs |
| 8 Å | InAlAs |
| 10 Å | InGaAs |
| 10 Å | InAlAs |
| 8 Å | InGaAs |
| 12 Å | InAlAs |
| 4 Å | InGaAs |
| 16 Å | InAlAs |
| | Bottom Barrier (InAlAs) |

For a silicon field effect transistor, a backplane is formed in the substrate, then the rest of the device structures, and then a backgate contact coupled to the backplane is formed.

In this manner, the kink effect experienced in field effect transistors can be eliminated by using the transistor structure and methods of making the same. For heterostructure field effect transistors, a combination of a graded region in the bottom barrier and a negatively biased backplane and backgate functions to neutralize the impact ionized holes. For silicon field effect transistors, the absence of the quantum well in the valence band only required a negatively charged backplane and backgate to successfully collect and neutralize the impact ionized holes.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims. More particularly, it is important to note that the chemical compositions, concentrations, polarities, conductivity types, and other detailed specifications enumerated above serve as illustrative examples and may be substituted by other such specifications as known in the art of semiconductor processing without departing from the present invention.

What is claimed is:

1. A method of operating a kink-free field effect device, comprising:

applying bias voltages to a gate, source and drain of the field effect device;

applying a negative bias voltage to a conductive backplane of the field effect device; and attracting and collecting impact ionized holes generated near the valence band of the field effect device by the conductive backplane.

2. The method, as set forth in claim 1, further comprising applying the negative bias voltage to a backgate electrically coupled to the conductive backplane.

3. The method, as set forth in claim 1, further comprising lessening the slope of a quantum well in the valence band by grading a region between a channel and a bottom barrier of the field effect device.

4. The method, as set forth in claim 1, further comprising lessening the slope of a quantum well in the valence band by grading a region between a channel and a bottom barrier of the field effect device, and applying the negative bias voltage to a backgate electrically coupled to the conductive backplane.

* * * * *